United States Patent
Otsuki

(10) Patent No.: US 6,824,825 B2
(45) Date of Patent: Nov. 30, 2004

(54) METHOD FOR DEPOSITING METALLIC NITRIDE SERIES THIN FILM

(75) Inventor: Hayashi Otsuki, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/307,487

(22) Filed: Dec. 2, 2002

(65) Prior Publication Data
US 2003/0129309 A1 Jul. 10, 2003

Related U.S. Application Data

(63) Continuation-in-part of application No. 09/660,546, filed on Sep. 12, 2000, now abandoned.

(51) Int. Cl.[7] ............................................. C23C 16/34
(52) U.S. Cl. ........................ 427/255.38; 427/255.391; 427/255.394
(58) Field of Search ................. 427/255.391, 255.394, 427/255.38

(56) References Cited

U.S. PATENT DOCUMENTS

| | | | |
|---|---|---|---|
| 5,514,908 A | | 5/1996 | Liao et al. |
| 5,561,326 A | | 10/1996 | Ito et al. |
| 5,595,603 A | * | 1/1997 | Klinedinst et al. ........... 118/715 |
| 5,604,140 A | | 2/1997 | Byun |
| 5,652,464 A | | 7/1997 | Liao et al. |
| 5,950,107 A | | 9/1999 | Huff et al. |
| 5,972,178 A | | 10/1999 | Narasimhan et al. |
| 5,985,759 A | | 11/1999 | Kim et al. |
| 6,087,261 A | * | 7/2000 | Nishikawa et al. ........... 438/685 |
| 6,221,174 B1 | * | 4/2001 | Chen et al. ................... 148/237 |

FOREIGN PATENT DOCUMENTS

| | | | |
|---|---|---|---|
| DE | 19649684 | 9/1997 | |
| JP | 2-43726 | 2/1990 | |
| JP | 3-153024 | 7/1991 | |
| JP | 3-211826 | 9/1991 | |
| JP | 4-45536 | 2/1992 | |
| JP | 4-216622 | 8/1992 | |
| JP | 5-6865 | 1/1993 | |
| JP | 7-74168 | 3/1995 | |
| JP | 7-130854 | 5/1995 | |
| JP | 7-263359 | 10/1995 | |
| JP | 8-97209 | 4/1996 | |
| JP | 9-306870 | 11/1997 | |
| JP | 09306870 A | * 11/1997 | ......... H01L/21/285 |

* cited by examiner

*Primary Examiner*—Timothy Meeks
(74) *Attorney, Agent, or Firm*—Smith, Gambrell & Russell, LLP

(57) ABSTRACT

The present invention generally relates to a method for depositing a metallic nitride series thin film, typically a TiN-series thin film. The TiN-series thin film according to the present invention is formed by a CVD, and contains Ti, O and N to have a higher barrier characteristic than those of conventional TiN thin films, so that TiN-series thin film can suitably used as a barrier layer. In addition, a TiN-series thin film according to the present invention is formed by a CVD, and contains Ti, N and P to have a lower resistance than those of conventional TiN films, so that TiN-series thin film can suitably used as a barrier layer or a capacitor top electrode. Moreover, if a TiN-series thin film containing Ti, O, N and P is formed by a CVD, the TiN-series thin film can have both of a high barrier characteristic and a low resistance characteristic.

43 Claims, 9 Drawing Sheets

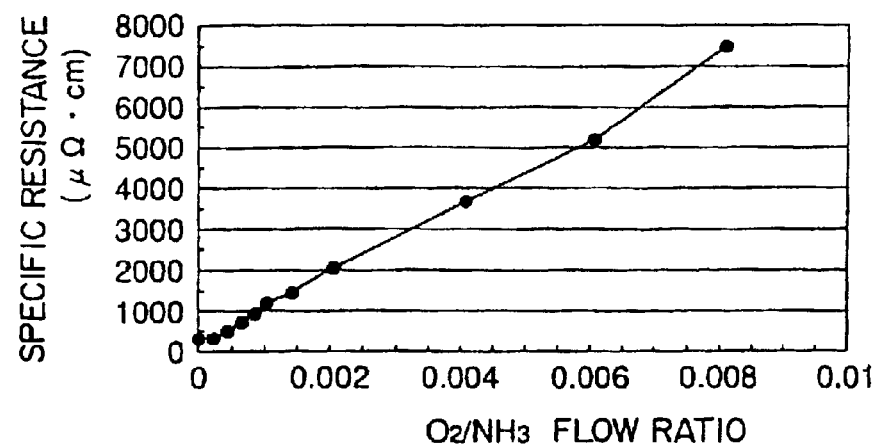
F I G. 2
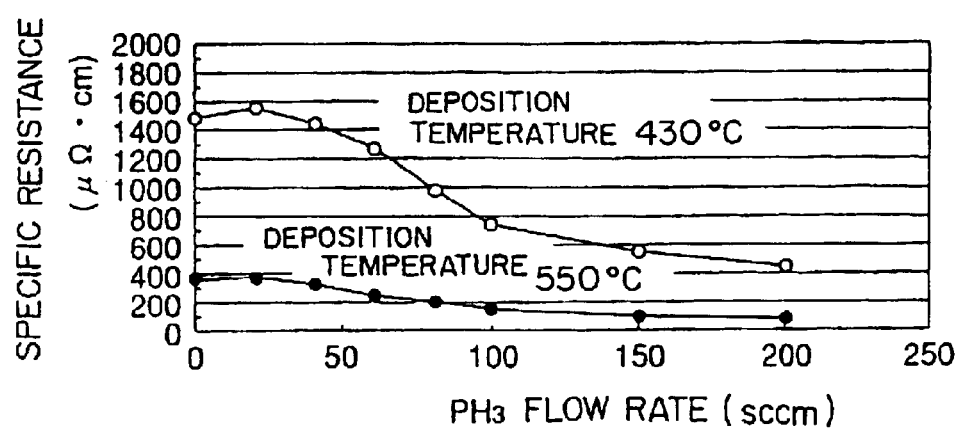
F I G. 3

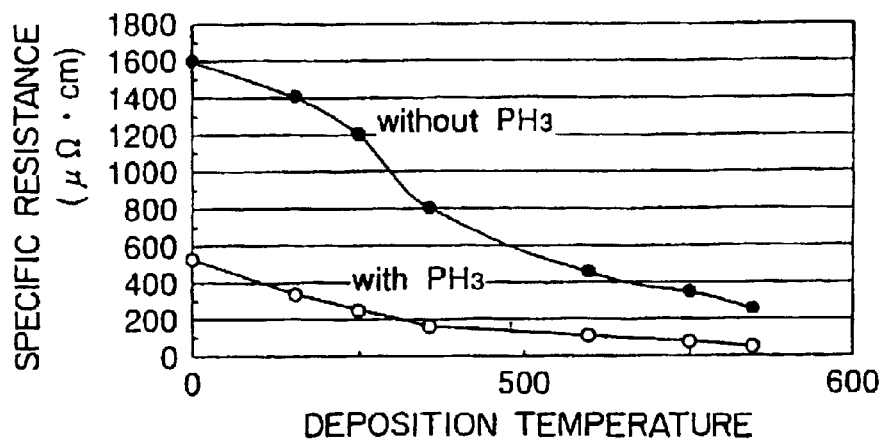
F I G. 4
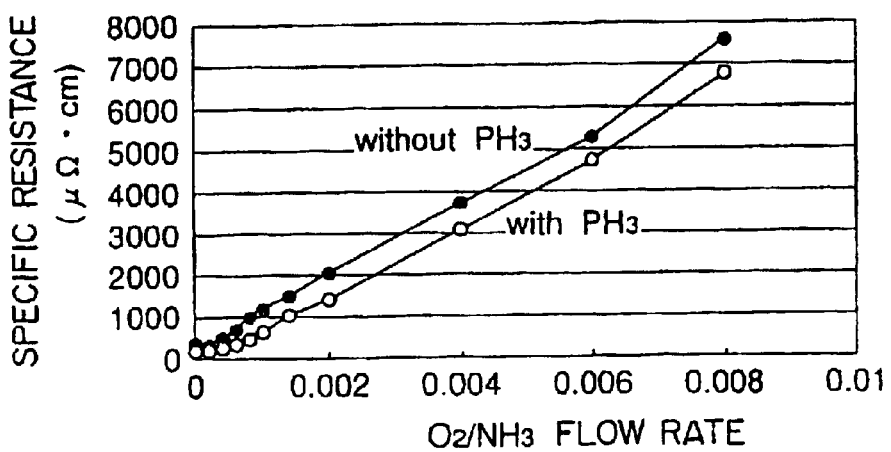
F I G. 5

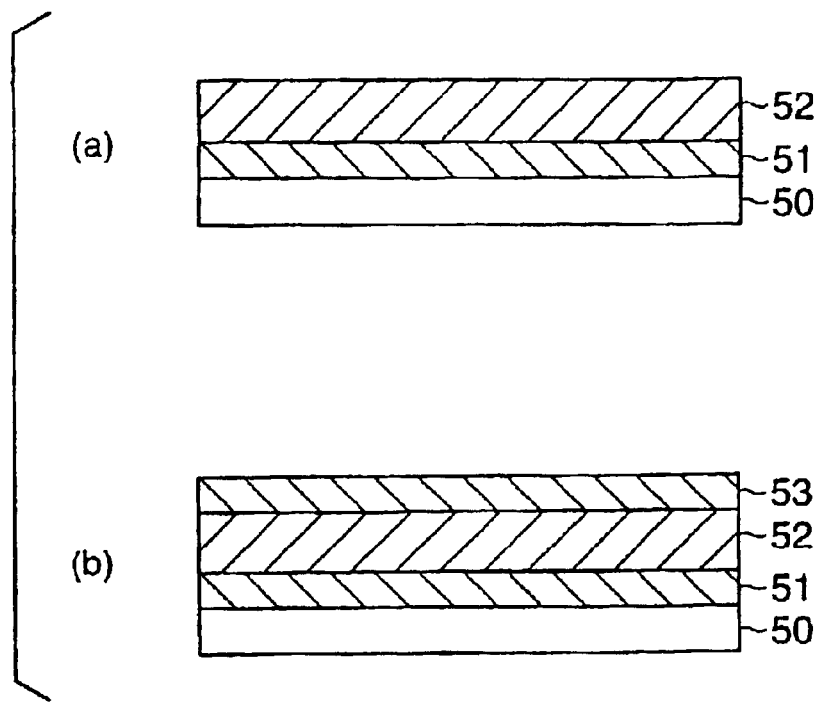
F I G. 6
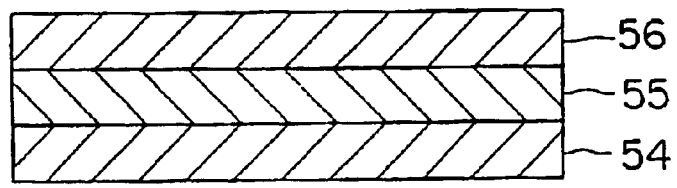
F I G. 7

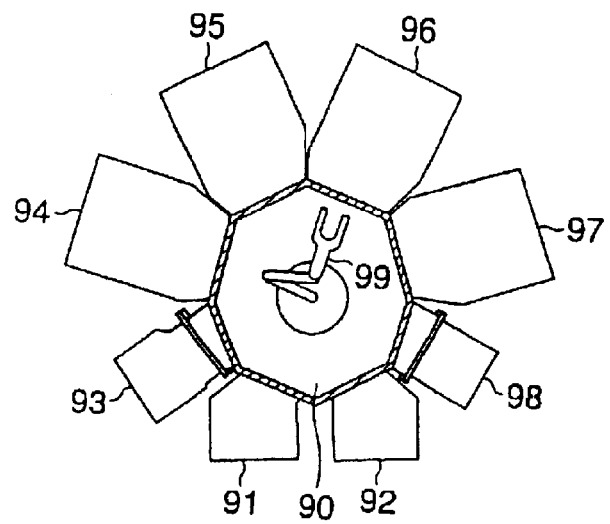
F I G. 10
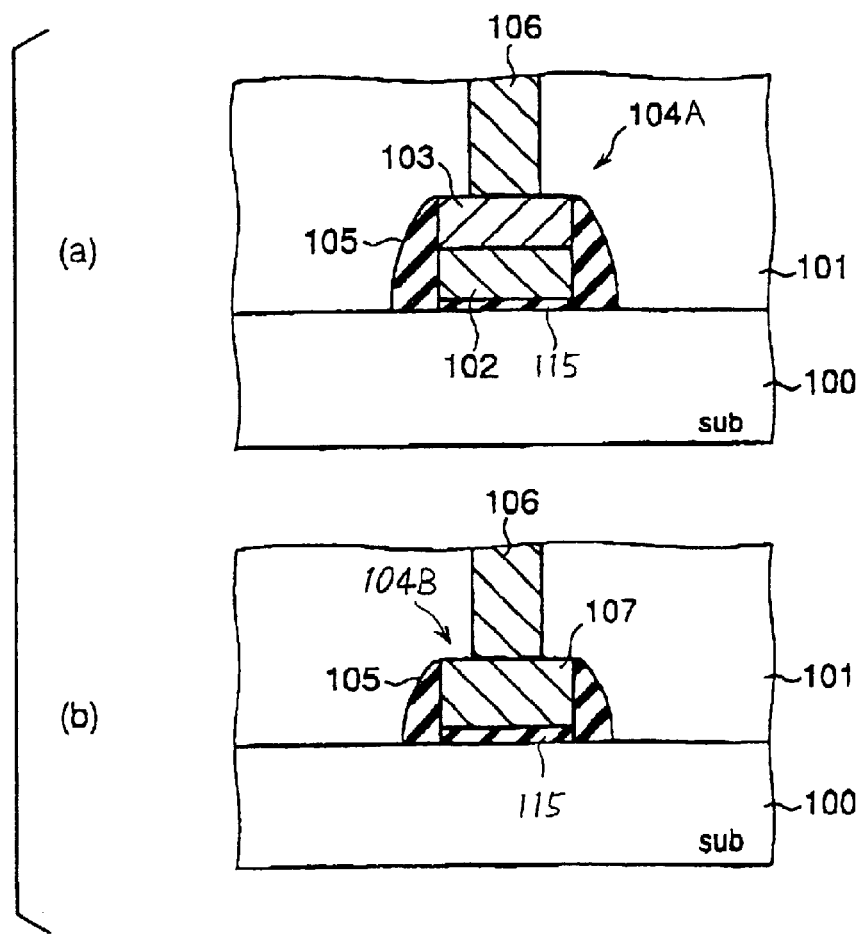
F I G. 11

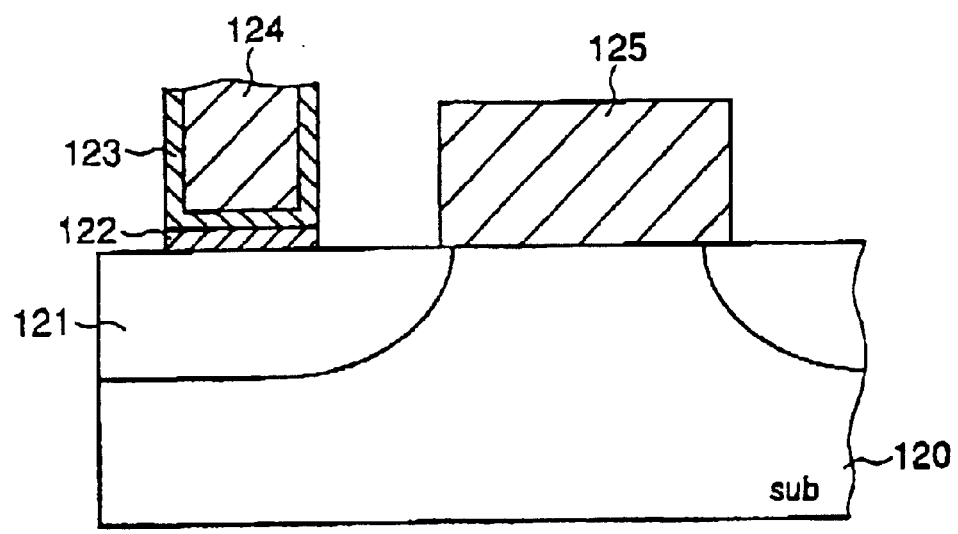
F I G. 13

METHOD FOR DEPOSITING METALLIC NITRIDE SERIES THIN FILM

CROSS REFERENCE TO RELATED APPLICATION

This is a continuation-in-part application of patent application Ser. No. 09/660,546 filed on Sep. 12, 2000, now abandoned.

BACKGROUND OF THE INVENTION

1. Field of the Invention

The present invention relates generally to a method for depositing a metallic nitride series thin film, typically a TiN-series thin film, which is used as, e.g., a barrier layer, a capacitor top electrode, a gate electrode or a contact part, in a semiconductor device.

2. Description of the Related Art

In the production of semiconductor devices, the construction of circuits tends to have a multilayer metallization structure on a recent demand for higher density and higher density integration. Therefore, an embedding technique for electrical connections between layers, such as a contact hole which is a connecting part between a bottom semiconductor device layer and a top wiring layer, and a via hole which is a connecting part between top and bottom wiring layers, is important. In addition, with the high-density integration, a technique for depositing a top electrode of capacitor gate material of a DRAM memory part, at a high coverage is important. Recently, a high dielectric material, such as $Ta_2O_5$, is used as a capacitor gate material.

In the embedding of the contact hole and via hole of the above described techniques, Al (aluminum), W (tungsten) or an alloy mainly containing Al or W is generally used. If such a metal or alloy directly contacts an underlying Si (silicon) substrate or Al wiring, there is the possibility that an alloy of both metals is formed due to the Si-suction effect of Al (counter diffusion) in the boundary portion between the metals. The alloy thus formed has a large value of resistance, so that the formation of such an alloy is not preferred from the point of view of the decrease of power consumption and high speed operation which are recently required for devices.

In addition, when W or a W alloy is used as an embedded layer for a contact hole, $WF_6$ gas used for forming the embedded layer tends to react with silicon of the substrate to deteriorate electrical characteristics to obtain undesired results.

Therefore, in order to prevent these disadvantages, before an embedded layer is formed in a contact hole or a via hole, a barrier layer is formed on the inner walls thereof, and the embedded layer is formed thereon. In this case, as the barrier layer, a double layer structure of a Ti (titanium) film and a TiN (titanium nitride) film is generally used.

Conventionally, such a barrier layer is deposited using a physical vapor deposition (PVD). Recently, the scale down and high density integration of devices are particularly required, and the design rule is particularly severe. In accordance therewith, the line width and the diameter of holes further decrease and the aspect ratio increases. As a result, the embedding performance of the PVD film is bad, so that it is not possible to ensure a sufficient contact resistance.

Therefore, the Ti film and TiN film constituting the barrier layer are deposited by a chemical vapor deposition (CVD) capable of expecting to form a better quality of film. When the Ti film is deposited by the CVD, $TiCl_4$ (titanium tetrachloride) and $H_2$ (hydrogen) are used as reaction gases to be activated as plasma to deposit the film. When the TiN film is deposited, $TiCl_4$ and $NH_3$ (ammonia) or MMH (monomethyl hydrazine) are used as reaction gases.

On the other hand, as described above, with the high density integration, a high dielectric material, such as $Ta_2O_5$, is used as a capacitor gate material in order to obtain a high capacitance without changing scale. However, such a high dielectric material is not more stable than $SiO_2$ which has been conventionally used as a capacitor gate material. Therefore, when a polysilicon, which has been conventionally used as a top electrode, is used, it is oxidized by heat history after the preparation of a capacitor, so that it is impossible to form a stable device. Therefore, TiN or the like, which is more difficult to be oxidized, is required as a top electrode.

Also in the case of this technique, the TiN film or the like has been conventionally deposited by the above described PVD. However, a recent highly integrated capacitor type, which requires a high coverage, e.g., a crown type, a fin type, or a RUG polysilicon, which has irregularities formed on a polysilicon layer in order to increase the capacity of a capacitor when the crown type or fin type is formed, can not be deposited as a top electrode.

Therefore, a TiN film constituting a capacitor top electrode is also deposited by a CVD which is expected to be capable of forming a better quality of film at a high coverage. Also in this case, $TiCl_4$ and $NH_3$ or MMH are used as reaction gases for depositing the TiN film.

By the way, when a Tin film is thus deposited by the CVD, Cl (chlorine) remains in the film, so that the deposited film has a high specific resistance. If the specific resistance is so high, it is not possible to obtain sufficient characteristics when it is applied to a capacitor top electrode. In addition, the formed film is a high stress film. Moreover, the TiN film, which is a columnar crystal, has a low barrier characteristic since intergranular diffusion is easy to occur therein. In particular, the low barrier characteristic causes problems when the TiN film is used as a barrier layer for a Cu (copper) wiring or when the TiN film is used as an oxygen diffusion barrier, on the occasion of forming a $Ta_2O_5$ capacitor top electrode. That is, the corrosion of the Cu wiring due to the remaining chlorine and the decrease of the capacity of $Ta_2O_5$ due to the diffusion of O (oxygen), which increases the thickness of the $Ta_2O_5$ film, cause problems.

SUMMARY OF THE INVENTION

The inventor has found that a TiN-series thin film, which is deposited by a CVD and which contains Ti, O and N (nitride), has a higher barrier characteristic than that of a conventional TiN film, and is suitable for a barrier layer. In addition, the inventor has found that a TiN-series thin film, which is deposited by a CVD and which contains Ti, N and P (phosphorus), has a lower resistance than that of a conventional TiN film, and is suitable for a barrier layer and a capacitor top electrode. Moreover, the inventor has found that the TiN-series thin film simultaneously containing O and P having the above described functions has both of a high barrier characteristic and a low resistance characteristic.

It is therefore an object of the present invention to provide a method for depositing a high-quality metallic nitride series, typically TiN-series, thin film having a higher barrier characteristic and/or a lower resistance than those of a conventional TiN film formed by a CVD.

The present invention also relates to a method for producing a film structure including such a metallic nitride series thin film.

Therefore, there is provided a method for depositing a TiN-series thin film, said method comprising the steps of: arranging a substrate in a process vessel; evacuating said process vessel, while heating said substrate; pre-heating said substrate while introducing a $N_2$ gas and a $NH_3$ gas into said process vessel; pre-flowing a $TiCl_4$ gas and an O-containing gas, without introducing same into said process vessel; and introducing said $TiCl_4$ gas, said $N_2$ gas, said $NH_3$ gas and said O-containing gas into said process vessel to form a thin film containing Ti, O and N on said substrate by a CVD, wherein flow rates of said gases in said pre-flowing step are equal to those in said introducing step.

There is also provided a method for depositing a TiN-series thin film, said method comprising the steps of: arranging a substrate in a process vessel; evacuating said process vessel, while heating said substrate; pre-heating said substrate while introducing a $N_2$ gas and a $NH_3$ gas into said process vessel; pre-flowing a $TiCl_4$ gas, an O-containing gas and a $PH_3$ gas, without introducing same into said process vessel; and introducing said $TiCl_4$ gas, said $N_2$ gas, said $NH_3$ gas, said O-containing gas and said $PH_3$ gas into said process vessel to form a thin film containing Ti, O, N and P on said substrate by a CVD.

There is also provided a method for depositing a TiN-series thin film, said method comprising the steps of: arranging a substrate in a process vessel; evacuating said process vessel, while heating said substrate; pre-heating said substrate while introducing a $N_2$ gas and a $NH_3$ gas into said process vessel; pre-flowing a $TiCl_4$ gas and an O-containing gas, without introducing same into said process vessel; introducing said $TiCl_4$ gas, said $N_2$ gas, said $NH_3$ gas and said O-containing gas into a process vessel to form a first thin film containing Ti, O and N by a CVD; pre-flowing $TiCl_4$ gas and $PH_3$ gas, without introducing same into said process vessel; and introducing said $TiCl_4$ gas, said $N_2$ gas, said $NH_3$ gas and said $PH_3$ gas into said process vessel to form a second thin film containing Ti, N and P on said first thin film by a CVD.

There is also provided a method for depositing a TiN-series thin film, said method comprising the steps of: arranging a substrate in a process vessel; evacuating said process vessel, while heating said substrate; pre-heating said substrate while introducing a $N_2$ gas and a $NH_3$ gas into said process vessel; pre-flowing a $TiCl_4$ gas and a first O-containing gas, without introducing same into said process vessel; introducing said $TiCl_4$ gas, said $N_2$ gas, said $NH_3$ gas and said first O-containing gas into a process vessel to form a first thin film containing Ti, O and N by a CVD; pre-flowing a $TiCl_4$ gas and a $PH_3$ gas, without introducing same into said process vessel; introducing said $TiCl_4$ gas, said $N_2$ gas, said $NH_3$ gas and said $PH_3$ gas into said process vessel to form a second thin film containing Ti, N and P on said first thin film by a CVD; pre-flowing a $TiCl_4$ gas and a second O-containing gas, without introducing same into said process vessel; and introducing said $TiCl_4$ gas, said $N_2$ gas, said $NH_3$ gas and said second O-containing gas into said process vessel to form a third thin film containing Ti, O and N on said second thin film by a CVD.

There is also provided a method for depositing a TiN-series thin film, said method comprising the steps of: arranging a substrate in a process vessel; evacuating said process vessel, while heating said substrate; pre-heating said substrate while introducing a $N_2$ gas and a $NH_3$ gas into said process vessel; pre-flowing a $TiCl_4$ gas and a $PH_3$ gas, without introducing same into said process vessel; and introducing said $TiCl_4$ gas, said $N_2$ gas, said $NH_3$ gas and said $PH_3$ gas into said process vessel to form a thin film containing Ti, N and P on said substrate by a CVD.

There is also provided a method for producing a film structure, said method comprising the steps of: forming a first conductive layer on a substrate; forming a TiN-series thin film on said first conductive layer; and forming a second conductive layer on said TiN-series thin film, wherein said step of forming a TiN-series thin film includes the sub-steps of: arranging said substrate in a process vessel; evacuating said process vessel, while heating said substrate; pre-heating said substrate while introducing a $N_2$ gas and a $NH_3$ gas into said process vessel; pre-flowing a $TiCl_4$ gas and at least one of an O-containing gas and a $PH_3$ gas, without introducing same into said process vessel; and introducing said $TiCl_4$ gas, said $N_2$ gas, said $NH_3$ gas, and said at least one of said O-containing gas and said $PH_3$ gas into said process vessel to form a thin film containing Ti, N , and at least one of O and P on said first conductive layer by a CVD, wherein flow rates of said gases in said pre-flowing step are equal to those in said introducing step.

As described above, the TiN-series thin film formed by the method according to the present invention contains Ti, O and N to have a higher barrier characteristic than those of conventional TiN films, so that the TiN-series thin film is suitable for a barrier layer. In addition, the TiN-series thin film according to the present invention is formed by a CVD and contains Ti, N and P to have a lower resistance than those of conventional TiN films, so that the TiN-series thin film is suitable for a barrier layer or a capacitor top electrode.

In addition, the TiN-series thin film, which is formed by a CVD and which contains Ti, O, N and P, can have both of a high barrier characteristic and a low resistance characteristic.

Moreover, if the TiN-series thin film has a stacked structure of a first thin film which is formed by a CVD and which contains Ti, O and N, and a second thin film which is formed by a CVD and which contains Ti, N and P, the high barrier characteristic of the first layer and the low resistance characteristic of the second layer can provide obtain characteristics which are the same as or superior to conventional barrier layers even if the thickness is smaller than the conventional barrier layers.

In addition, if the TiN-series thin film has a stacked structure of a first thin film which is formed by a CVD and which contains Ti, O and N, a second thin film which is formed by a CVD and which contains Ti, N and P, and a third thin film which is formed by a CVD and which contains Ti, O and N, it is possible to obtain the barrier characteristic against layers on both sides.

Moreover, in a semiconductor device, these TiN-series thin films are used as (1) a barrier layer or an embedded wiring portion in a contact part between a wiring layer and a semiconductor substrate or a conductive layer arranged thereon, (2) a top electrode layer, barrier layer or bottom electrode of a capacitor portion having an insulating layer of $Ta_2O_5$, RuO and so forth, (3) at least a part of a gate electrode, and (4) a contact structure on a major surface of a semiconductor substrate, so that it is possible to obtain excellent characteristics.

According to the present invention, it is possible to deposit such TiN-series thin films of high-quality by carrying out the pre-heating step and/or the pre-flowing step. Specifically, by carrying out the pre-heating step, it is possible to stabilize the temperature of the substrate before the later step of forming a thin film. By carrying out the pre-flowing step, it is possible to stabilize the flows of the $TiCl_4$ gas, the O-containing gas and/or the $PH_3$ gas before the next step of introducing those gases into the process vessel, i.e. the step of forming a thin film. In addition, by carrying out the pre-flowing step, it is possible to precisely control the flow rates of those gases in the next step of forming a thin film, even if the flow rates are very small. It is more effective to equalize the flow rates in the pre-flowing step with those in the next step of forming a thin film.

According to the present invention, there is also provided a method for depositing a metallic nitride series thin film, said method comprising the steps of: arranging a substrate in a process vessel; evacuating said process vessel, while heating said substrate; pre-heating said substrate while introducing an inert gas and a reducing gas into said process vessel; pre-flowing a metallic-element containing gas and at least one of an O-containing gas, a $PH_3$ gas and a $B_2H_6$ gas, without introducing same into said process vessel; and introducing said metallic-element containing gas, said inert gas, said reducing gas, and at least one of said O-containing gas, a $PH_3$ gas and a $B_2H_6$ gas into said process vessel to form a metallic nitride thin film containing at least one of O, P and B on said substrate by a CVD, wherein flow rates of said gases in said pre-flowing step are equal to those in said introducing step.

There is also provided a method for producing a film structure, said method comprising the steps of: forming a dielectric layer on a first conductive layer; forming a metallic nitride series thin film on said dielectric layer; and forming a second conductive layer on said metallic nitride series thin film, wherein said step of forming a metallic nitride series thin film includes the sub-steps of: pre-flowing a metallic-element containing gas without introducing same into a process vessel; and introducing said metallic-element containing gas, a $N_2$ gas, a $NH_3$ gas, and at least one of an O-containing gas, a $PH_3$ gas and a $B_2H_6$ gas into a process vessel to form said metallic nitride series thin film comprising at least one of a thin film containing said metallic-element, O and N, a thin film containing said metallic-element, N and P, a thin film containing said metallic-element, N and B, a thin film containing said metallic-element, O, N and P and a thin film containing said metallic-element, O, N and B, by a CVD.

There is also provided a method for depositing a metallic nitride series thin film, said method comprising the steps of: arranging a substrate in a process vessel; evacuating said process vessel, while heating said substrate; pre-heating said substrate while introducing a N-containing gas into said process vessel; pre-flowing a metallic-element containing gas without introducing said metallic-element containing gas into said process vessel; and introducing said metallic-element containing gas, an inert gas and a reducing gas into said process vessel to form a metallic nitride series thin film on said substrate by a CVD, wherein flow rate of said metallic-element containing gas in said pre-flowing step is equal to that in said introducing step.

Thus, according to the present invention, it is possible to deposit such metallic nitride series thin films of high-quality by carrying out the pre-heating step and/or the pre-flowing step.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 2 is a graph showing the relationship between flow ratios $O_2/NH_3$ and the specific resistance values of a TiON thin film;

FIG. 3 is a graph showing the relationship between flow ratios $PH_3$ and the specific resistance values of a TiN-series thin film;

FIG. 4 is a graph showing the relationships between deposition temperatures and the specific resistance values of a TiN-series thin film when $PH_3$ is used and is not used;

FIG. 5 is a graph showing the relationships between flow ratios $O_2/NH_3$ and the specific resistance values of a TiN-series thin film when PH3 is use and is not used;

FIG. 6 is a sectional view showing examples (a) and (b) of a stacked structure of a TiN-series thin film according to the present invention;

FIG. 7 is a sectional view of a film structure using a TiN-series thin film according to the present invention;

FIG. 9 is a sectional view showing examples (a) through (c) of a TiN-series thin film according to the present invention which is used for a capacitor structure of a DRAM or the like;

FIG. 10 is a schematic view showing an example of a deposition system capable of continuously depositing a TiN-series thin film and other films according to the-present invention;

FIG. 11 is a sectional view showing examples (a) and (b) of a TiN-series thin film according to the present invention which is used for a gate electrode;

FIG. 13 is a sectional view showing an example of a TiN-series thin film according to the present invention which is used for a contact structure when a wiring is formed in a diffusion region formed in a major surface of a semiconductor substrate.

DESCRIPTION OF THE PREFERRED EMBODIMENTS

Referring now to the accompanying drawings, the preferred embodiments of the present invention will be described in detail below.

Figure 1:
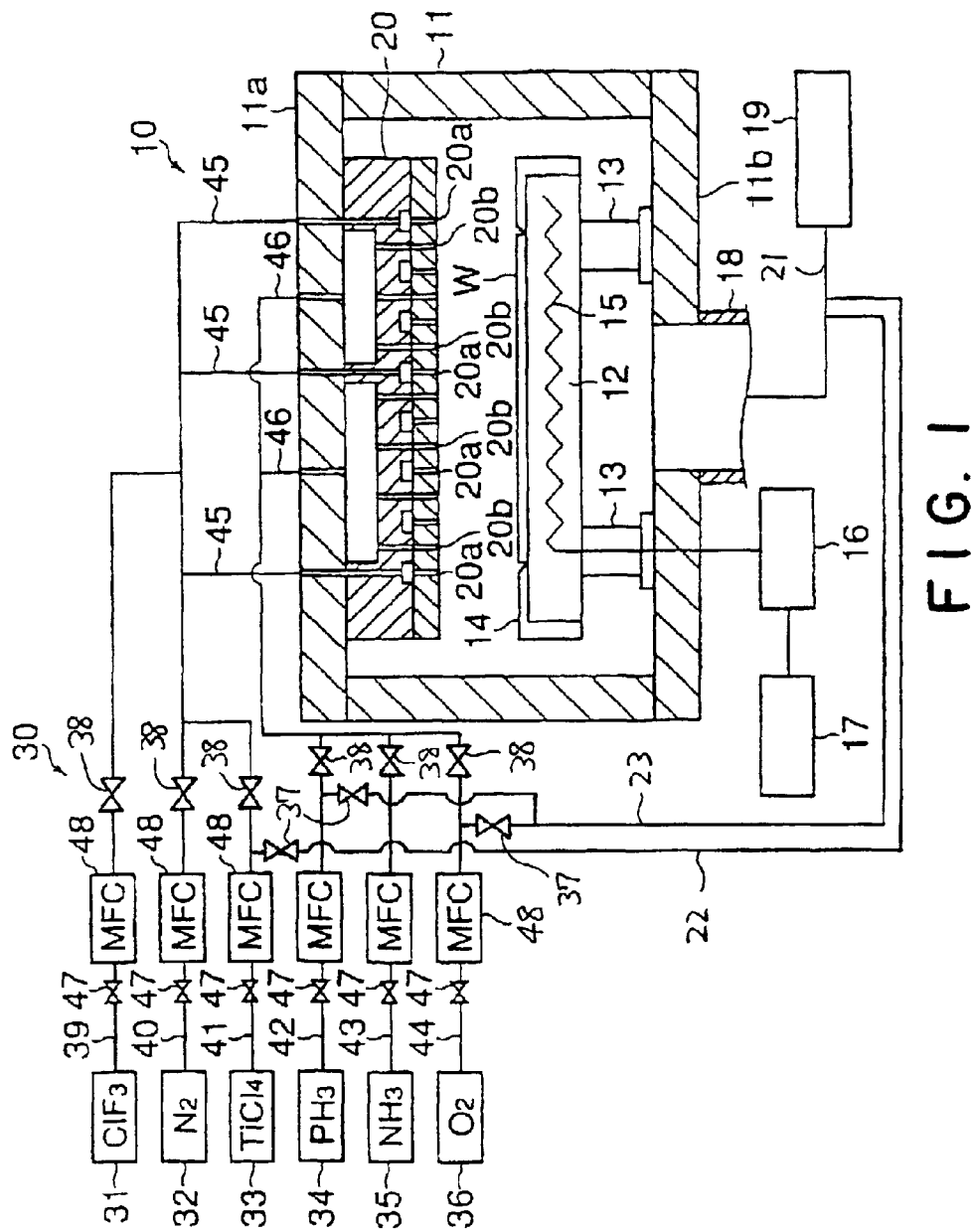
FIG. 1 is a sectional view of a deposition system for depositing a TiN-series thin film according to the present invention.

FIG. 1 is a sectional view of a deposition system for depositing a TiN-series thin film according to the present invention. This deposition system has a substantially cylindrical airtight process vessel 11, in which a susceptor 12 for horizontally supporting a semiconductor wafer W serving as an object to be processed is arranged while being supported on a cylindrical supporting member 13. On the outer edge portion of the susceptor 12, a guide ring 14 for guiding the semiconductor wafer W is provided. In addition, a heater 15 is embedded in the susceptor 12. When an electrical power is fed to the heater 15 from a power supply 16, the heater 15 heats the semiconductor waver W, which is an object to be processed, to a predetermined temperature. The power supply 16 is connected to a controller 17 which controls the output of the heater 15 in accordance with a signal from a temperature sensor (not shown).

The ceiling wall 11a of the process vessel 11 is provided with a shower head 20. In the shower head 20, a large number of gas discharging holes 20a and 20b for discharging a gas toward the susceptor 12 are alternately formed. To the shower head 20, the piping of a gas supply mechanism 30 is connected. As will be described later, main flow lines 45 for supplying TiCl$_4$ are connected to the gas discharging holes 20a, and main flow lines 46 for supplying NH$_3$ gas are connected to the gas discharging holes 20b, so that predetermined gases are introduced into the process vessel 11 via the shower head 20. Thus, the shower head 20 is a matrix type shower head, and adopts a post mix system wherein TiCl$_4$ and NH$_3$ gases serving as reaction gases are mixed after being discharged from the discharging holes 20a and 20b which are alternately formed.

The gas supply mechanism 30 has a ClF$_3$ supply source 31 for supplying ClF$_3$ which is a cleaning gas, an N$_2$ supply source 32 for supplying N$_2$, a TiCl$_4$ supply source 33 for supplying TiCl$_4$ which is a reaction gas, a PH$_3$ supply source 34 for supplying PH$_3$ serving as a P containing gas, an NH$_3$ supply source 35 for supplying NH$_3$ which is a reaction gas and which contains N and H, and an O$_2$ gas supply source 36 for supplying O$_2$ serving as an O-containing gas. In addition, a gas line 39 is connected to the ClF$_3$ supply source 31, a gas line 40 is connected to the N$_2$ supply source 32, a gas line 41 is connected to the TiCl$_4$ supply source 33, a gas line 42 is connected to the PH$_3$ supply source 34, a gas line 43 is connected to the NH$_3$ supply source 35, and a gas line 44 is connected to the O$_2$ gas supply source 36. Each of the lines 39 through 44 is provided with a mass flow controller 48 and first and second valves 47, 38 at the upstream side and the downstream side with respect to the mass flow controller 48, respectively.

The gas line 40 extending from the N$_2$ supply source 32 meets the gas line 41 extending from the TiCl$_4$ supply source 33, so that TiCL$_4$ gas carried on N$_2$ gas flowing through the gas line 40 and the pipe 45 is introduced into the process vessel 11 via the gas discharging holes 20a of the shower head 20. The gas line 39 extending from the ClF$_3$ supply source 31 meets the gas line 40, so that ClF$_3$ serving as a cleaning gas is introduced into the process vessel 11 from the gas discharging holes 20a via the gas lines 39 and 40 and the main flow lines 45 by opening the valve provided in the gas line 39. The gas lines 42, 43 and 44 extending from the PH$_3$, NH$_3$ and O$_2$ supply sources 34, 35 and 36 are connected to the main flow lines 46, so that those gases are introduced into the process vessel 11 from the gas discharging holes 20b of the shower head 20.

In addition, this deposition system has pre-flow lines 22, 23 for pre-flowing the gases from the gas supply sources 33, 34 and/or 36, and exhausting those gases before the main flow lines 45 and 46, i.e. before the process vessel 11. The pre-flow lines 22, 23 are connected, via third valves 37, to the corresponding gas lines 41, 42 and 44 between the mass flow controllers 48 and the second valves 38.

As the N-containing gas and the H containing gas, monomethyl hydrazine (MMH) may be used in place of NH$_3$, or an N-containing gas and an H containing gas may be introduced as separate gases. In addition, as the O-containing gas, NO gas or N$_2$O gas may be used in place of O$_2$ gas. Moreover, Ar may be substituted for N$_2$.

To the bottom wall 11b of the process vessel 11, an exhaust pipe 18 is connected. To this exhaust pipe 18, an exhaust system 19 including a vacuum pump is connected via an exhaust line 21. By operating the exhaust system 19, the pressure in the process vessel 11 can reduced to a predetermined degree of vacuum. The downstream ends of the pre-flow lines 22, 23 are connected to the exhaust line 21 so that the pre-flown gases are exhausted by the exhaust system 19.

A method for depositing a TiN-series thin film on a semiconductor wafer W using such a system will be described below.

First, the semiconductor wafer W is mounted on the susceptor 12 in the process vessel 11. Then, while the wafer W is heated by the heater 15, the process vessel 11 is evacuated to a high vacuum state by the exhaust system 19. Subsequently, N$_2$ gas and NH$_3$ gas are introduced into the process vessel 11 at a predetermined flow ratio so that the pressure in the process vessel 11 is 133 to 1333 Pa, while pre-heating the semiconductor wafer W at a temperature of about 400 to 700° C.

Then, the pressure in the process vessel 11 is changed to 13.3 to 133 Pa, and while the flow rates of N$_2$ gas and NH$_3$ gas are maintained, TiCl$_4$ gas and at least one of O$_2$ gas and PH$_3$ gas are pre-flown thorough the pre-flow lines 22, 23, without introducing those gases into the process vessel 11, at predetermined flowrates for about 5 to 20 seconds. Subsequently, the deposition of a predetermined TiN-series thin film is carried out by introducing TiCl$_4$ gas and at least one of O$_2$ gas and PH$_3$ gas thorough the main flow lines 45, 46 on the same conditions (flow rates of the gases, pressure in the process vessel 11, and so forth) as those in the pre-flowing step. At this time, the deposition of the TiN-series thin film is carried out at substantially the same temperature as that in the pre-heating step.

By carrying out the pre-heating step, it is possible to stabilize the temperature of the semiconductor wafer W before the later step of forming a thin film. By carrying out the pre-flowing step, it is possible to stabilize the flows of the TiCl$_4$ gas, the O-containing gas and/or the PH$_3$ gas before the next step of introducing those gases into the process vessel, i.e. the step of forming a thin film. In addition, by carrying out the pre-flowing step, it is possible to precisely control the flow rates of those gases in the next step of forming a thin film, even if the flow rates are very small. It is more effective to equalize the flow rates in the pre-flowing step with those in the next step of forming a thin film.

After the deposition, the semiconductor wafer is carried out from the process vessel 11. Then, ClF3 gas serving as a cleaning gas is introduced into the process vessel 11 to clean the interior of the process vessel 11.

When NH$_3$ gas, TiCl$_4$ gas and O$_2$ gas are used as process gasses in the above described deposition, a TiN-series film (TiON film), which contains Ti, N and O and which has a high barrier characteristic while maintaining a relatively low resistance value, is formed. That is, since the crystal of the TiN film is a columnar crystal, the intergranular diffusion, whereby metal or O may diffuse via the grain boundary of TiN crystal, is easy to occur therein. Therefor, if the TiN film is formed by the thermal CVD with the O-containing gas, the barrier characteristic of the grain boundary of TiN crystal can be improved. In this case, the volume ratio of O$_2$ to NH$_3$ is preferably in the range of from 0.0001 to 0.001. Thus, the value of resistance can be in a desired range.

FIG. 2 shows the relationship between the flow rates O$_2$/NH$_3$ and the specific resistance values of the TiON film.

In this case, the flow rate of TiCl$_4$ gas was 0.02 L/min, the flow rate of NH$_3$ gas was 0.5 L/min, the flow rate of N$_2$ was 0.15 L/min, and the flow rate of O$_2$ was changed in the range of from $5\times10^{-5}$ to $4\times10^{-3}$ L/min (the flow ratio O$_2$/NH$_3$ was in the range of from 0.00001 to 0.008). In addition, during the deposition, the substrate temperature was 550° C., the pressure in the process vessel was 300 mTorr, and the thickness of the film was 50 nm. As shown in FIG. 2, when the flow ratio O$_2$/NH$_3$ is in the above described range, the specific resistance (resistivity) value of the TiON film is in the range of from 360 to 7500 μΩ·cm which is an allowable range.

Furthermore, even if another gas, such as NO or N$_2$O, is used as the O-containing gas, the value of resistance can be in a suitable range by converting it into the above described range of O$_2$.

In addition, the barrier characteristic is good if the specific resistance value is about 700 μΩ·cm or higher. Therefore, it can be seen from FIG. 2 that the flow ratio O$_2$/NH$_3$ is 0.0006 or higher in order to obtain a good barrier characteristic.

Next, the process for forming a TiN-series film (TiNP film), which contains Ti, N and P, will be described below.

When NH$_3$ gas, TiCl$_4$ gas and PH$_3$ gas are used as process gases, a TiN-series film (TiNP film), which contains Ti, N and P and which has a low value of resistance while maintaining a relatively good barrier characteristic, is formed. By using PH$_3$ gas, it is possible to remove the remaining chlorine by the reducing function of PH$_3$ gas, so that it is possible to reduce the value of resistance of the TiN-series film. In this case, the flow rate of PH$_3$ is preferably in the range of from 0.04 to 0.5 L/min. If it is less than 0.04 L/min, it does not have so great effect. In addition, if the flow rate of PH$_3$ is 0.1 L/min or higher, the formed thin film is amorphous and compact, so that the resistance can be decreased and the barrier characteristic can be good.

FIG. 3 shows the relationship between the flow rates of PH$_3$ and the specific resistance values of the TiN-series film. In this case, the flow rate of TiCl$_4$ gas was 0.02 L/min, the flow rate of NH$_3$ gas was 0.5 L/min, the flow rate of N$_2$ was 0.15 L/min, and the flow rate of PH$_3$ was changed in the range of from 0 to 0.2 L/min. In addition, during the deposition, the substrate temperature was 430° C. and 550° C., the pressure in the process vessel was 40 Pa, and the thickness of the film was 50 nm. As shown in FIG. 3, when the flow rate of PH$_3$ is 0.04 L/min, the value of resistance clearly decreases. In addition, when the deposition temperature 550° C., the value of resistance tends to be lower. In the case of the deposition at 550° C., when the flow rate of PH$_3$ is 0.2 L/min, it is possible to obtain 70 μΩ·cm which is a very low value.

In this case, the relationship between deposition temperatures and the specific resistance values of the TiN-series film is shown in FIG. 4. As shown in FIG. 4, when PH$_3$ is added, the dependence of the specific resistance value on temperature is smaller than when PH$_3$ is not added, so that the value of resistance is stably low. Furthermore, in FIG. 4, the flow rate of TiCl$_4$ gas was 0.02 L/min, the flow rate of NH$_3$ gas was 0.5 L/min, the flow rate of N$_2$ was 0.15 L/min, and the flow rate of PH$_3$ was 0.2 L/min. In addition, the pressure in the process vessel was 40 Pa, and the thickness of the film was 50 nm.

Next, the process for forming a TiN-series film (TiONP film), which contains Ti, N, O and P, will be described below.

When NH$_3$ gas, TiCl$_4$ gas, O$_2$ gas and PH$_3$ gas are used as process gasses in the deposition, it is possible to obtain a TiN-series film (TiONP film) which contains Ti, N, O and P and which has both of a high barrier characteristic and a low resistance characteristic. That is, although the barrier characteristic is improved by supplying O$_2$ gas during the deposition, the value of resistance increases as the amount of O$_2$ (the flow ratio O$_2$/NH$_3$) increases, as shown in FIG. 5. However, by introducing P by supplying PH$_3$ gas, the value of resistance can be lower than that when P is not introduced, so that it is possible to obtain a TiN-series film which has both of a high barrier characteristic and a low resistance characteristic. Furthermore, in FIG. 5, the flow rate of TiCl$_4$ gas was 0.02 L/min, the flow rate of NH$_3$ gas was 0.5 L/min, the flow rate of N$_2$ was 0.15 L/min, the flow rate of PH$_3$ was 0.2 L/min and 0 L/min, and the flow rate of O$_2$ was changed in the range of from $5\times10^{-5}$ to $1\times10^{-3}$ L/min (the flow ratio O$_2$/NH$_3$ was in the range of from 0.0001 to 0.001). In addition, the pressure in the process vessel was 40 Pa, and the thickness of the film was 50 nm.

During the above described deposition, a single TiN-series film was formed without changing gas. On other hand, if a stacked film comprising a plurality of TiN-series films is formed as follows, it is possible to obtain a higher barrier characteristic by a smaller thickness. Specifically, as shown in FIG. 6(a), TiCl$_4$ gas, NH$_3$ gas and O$_2$ gas are first introduced into the process vessel 11 to form a first thin film 51 containing Ti, O and N on an underlying layer 50. Thereafter, the O$_2$ line 44 is closed and the PH$_3$ gas line is open to introduce TiCl$_4$ gas, NH$_3$ gas and PH$_3$ gas into the process vessel 11 to form a second thin film 52 containing Ti, N and P on the first thin film 51.

By forming such a double layer structure, it is possible to improve the barrier characteristic while maintaining the same specific resistance as conventional specific resistance values if the thickness of the film is smaller than those of conventional films. In this case, the thickness of the first thin film 51 is preferably in the range of from 1 to 10 nm, and the thickness of the second thin film 52 is preferably in the range of from 3 to 50 nm.

In particular, when a film is used as a barrier layer for a Cu wiring layer, the thickness of a conventional TiN film must be 50 nm or more in order to obtain good barrier effects. However, if such a stacked structure is formed, even if the thickness of the first thin film 51, which is a high barrier TiON film, is in the range of from 1 to 5 nm and the thickness of the second thin film 52, which is a low-resistance TiN-series film containing P, is in the range of from 5 to 20 nm so that the total thickness is decreased to 25 nm or less which is smaller than the conventional thickness, the barrier layer can have the same barrier characteristic and resistance values as those of conventional TiN films. Furthermore, the first thin film and the second thin film may be deposited in reverse order.

In addition, as shown in FIG. 6(b), a TiN film may have a triple layer structure. In this case, TiCl$_4$ gas, NH$_3$ gas and O$_2$ gas are first introduced into the process vessel 11 to form a first thin film 51 containing Ti, O and N on an underlying layer 50. Thereafter, the O$_2$ line 44 is closed and the PH$_3$ gas line is open to introduce TiCl$_4$ gas, NH$_3$ gas and PH$_3$ gas into the process vessel 11 to form a second thin film 52 containing Ti, N and P on the first thin film 51. Thereafter, the PH$_3$ gas line 42 is closed and the O$_2$ line 44 is open again to introduce TiCl$_4$ gas, NH$_3$ gas and O$_2$ gas into the process vessel 11 to form a third film containing Ti, O and N on the second thin film 52.

By forming such a triple layer structure, it is possible to improve the barrier characteristic against the films on both sides while maintaining the same specific resistance and the thickness of the film is smaller than those of conventional films. In this case, the thickness of the first thin film 51 and third thin film 53 is preferably in the range of from 1 to 10 nm, and the thickness of the second thin film 52 is preferably in the range of from 3 to 50 nm. Such a triple layer structure can be effectively used as, e.g., a top electrode of a capacitor portion having an insulating layer of $Ta_2O_5$ or RuO.

The above described double layer and triple layer structures can be formed in a short time without any difficulty since each layer can be continuously formed only by switching gases in the same system.

Furthermore, in either case of the above described double layer and triple layer structures, a P containing gas may be introduced into the process vessel when the first thin film 51 and/or the third thin film 53 is formed. When a thin film containing Ti, O, N and P is formed or when the second thin film 52 is formed, if an O-containing gas is introduced into the process vessel, a thin film containing Ti, O, N and P can be formed. Thus, it is possible to further improve characteristics in accordance with a film to be obtained.

As described above, the TiN-series thin film obtained according to the present invention has at least one of a high barrier characteristic and a low resistance characteristic to be suitable for a barrier layer for a metal wiring layer and for a top electrode of a capacitor even if it has a single layer structure or a stacked structure.

The TiN-series thin film according to the present invention is actually used as a film structure which is stacked on another layer. Specifically, as shown in, e.g., FIG. 7, a TiN thin film 55 of any one of a thin film containing Ti, O and N, a thin film containing Ti, N and P, and a thin film containing Ti, O, N and P is provided between the other first layer 54 and the second layer 56.

Such a film structure can be applied to various portions of semiconductor devices. For example, a contact layer, such as a Ti thin film, a TiSi thin film or a CoSi thin film, is formed as the first layer 54, and the TiN thin film 55 according to the present invention is formed thereon. Then, a metal layer, e.g., W, Al or Cu layer, which is applied as a wiring layer or an embedded wiring portion, is formed thereon as the second layer. In addition, a CoSi thin film serving as the first layer 54 may be used as a gate electrode, and a metal layer serving as a wiring layer may be formed via a TiN-series thin film electrode according to the present invention serving as a barrier layer. Moreover, such a film structure can be applied to a capacitor portion or metal gate electrode portion of a DRAM as will be described later.

When the TiN-series thin film thus used according to the present invention is formed by the CVD, before the TiN-series film is formed by the above described system shown in FIG. 1 (i.e., before $NH_3$ gas, $TiCl_4$ gas, and $O_2$ gas and/or $PH_3$ gas are introduced), or after the supply of $NH_3$ gas and $PH_3$ gas is stopped to complete the formation of the thin film, or at both times, an O-containing gas ($O_2$ gas in the above described system shown in FIG. 1) is introduced into the process vessel 11. Specifically, a first layer of, e.g., a Ti thin film, a TiSi thin film and a CoSi thin film, is first formed by the PVD or CVD (the plasma CVD or thermal CVD). Thereafter, before the TiN-series thin film is formed by the CVD, $O_2$ gas is introduced into a CVD process vessel, and after the TiN-series thin film is formed, $O_2$ gas is introduced again. Thereafter, a second layer of a metal of, e.g., Al, W or Cu, is formed by the PVD or CVD (the plasma CVD or thermal CVD). Furthermore, any one of the introductions of $O_2$ gas may be omitted.

By the introduction of oxygen at this time, a thin oxide film is formed on the underlying first layer and/or the TiN-series thin film, so that it is possible to enhance the barrier characteristic against the adjacent first layer and/or second layer. Therefore, when the thin film containing Ti, O and N and the thin film containing Ti, O, N and P are formed, it is possible to reduce the amount of O to maintain a good barrier characteristic. Furthermore, even if the TiN-series thin film is the above described stacked film, such effects can be obtained by introducing an O-containing gas before and/or after the thin films are continuously deposited in the process vessel 11.

Referring to FIGS. 8(a) through 8(c), examples of a TiN-series thin film according to the present invention, which is used as a contact part of a metal wiring layer, will be described below.

In the example shown in FIG. 8(a), an interlayer dielectric film 61 is formed on a silicon substrate 60, and a contact hole 62 extending downwardly to an impurity diffusion region 60a of the silicon substrate 60 is formed in the interlayer dielectric layer 61. On the surface of the interlayer dielectric film 61 and contact hole 62, an Ti thin film 63 and a TiN-series thin film 64 according to the present invention are formed. On the TiN-series thin film 64, a metal wiring layer 66 of, e.g., Cu or W, is formed. This metal wiring layer 66 is also filled in the contact hole 62, so that the conducting state between the impurity diffusion region 60a of the silicon substrate 60 and the metal wiring layer 66 is established.

Since the TiN-series thin film 64 has a higher barrier characteristic than those of conventional TiN thin film, the presence of the TiN-series thin film 64 can very effectively prevent the formation of a compound by a reaction of Cu or W with Si. In addition, since the TiN-series thin film 64 has such a high barrier characteristic, it is possible to very effectively prevent the diffusion of $Cl_2$. The TiN-series thin film 64 is preferably a TiON film or a TiONP film in order to obtain a high barrier characteristic. In addition, a TiNP film may be used since it has a relatively high barrier characteristic if it is amorphous. In this case, it is not always required to provide the Ti thin film 63.

In the example shown in FIG. 8(b), similar to the example shown in FIG. 8(a), an interlayer dielectric film 61 is formed on a silicon substrate 60, and a contact hole 62 extending downwardly to an impurity diffusion region 60a of the silicon substrate 60 is formed in the interlayer dielectric layer 61. On the surface of the interlayer dielectric film 61 and contact hole 62, an Ti containing film 69 having a double stacked structure of a TiNP film 67 and a TiON film 68 is provided. On the TiN-series thin film 69, a metal wiring layer 66 of, e.g., Cu or W, is formed. This metal wiring layer 66 is also filled in the contact hole 62, so that the conducting state between the impurity diffusion region 60a of the silicon substrate 60 and the metal wiring layer 66 is established. Thus, the TiNP film 67 functions as a contact layer, and the TiON film 68 functions as a barrier layer, so that it is possible to obtain better characteristics than those of conventional Ti/TiN films.

In the example shown in FIG. 8(c), similar to the example shown in FIG. 8(a), an interlayer dielectric film 61 is formed on a silicon substrate 60, and a contact hole 62 extending downwardly to an impurity diffusion region 60a of the silicon substrate 60 is formed in the interlayer dielectric layer 61. In the contact hole 62, an embedded wiring layer (plug) 70 of a TiNP thin film is formed, and a metal wiring layer 72 of Cu or W is formed thereon via a TiON barrier layer 71. As described above, the TiNP thin film has a low resistance, it can be thus used as the embedded wiring layer.

Furthermore, the metal wiring layers 66 and 72 may be made of any one of metals other than Cu and W, or an alloy. In addition, the metal wiring layers 66 and 72 may be applied to via hole portions conducting to other conductive layers, in addition to the contact hole portion.

Figure 9:
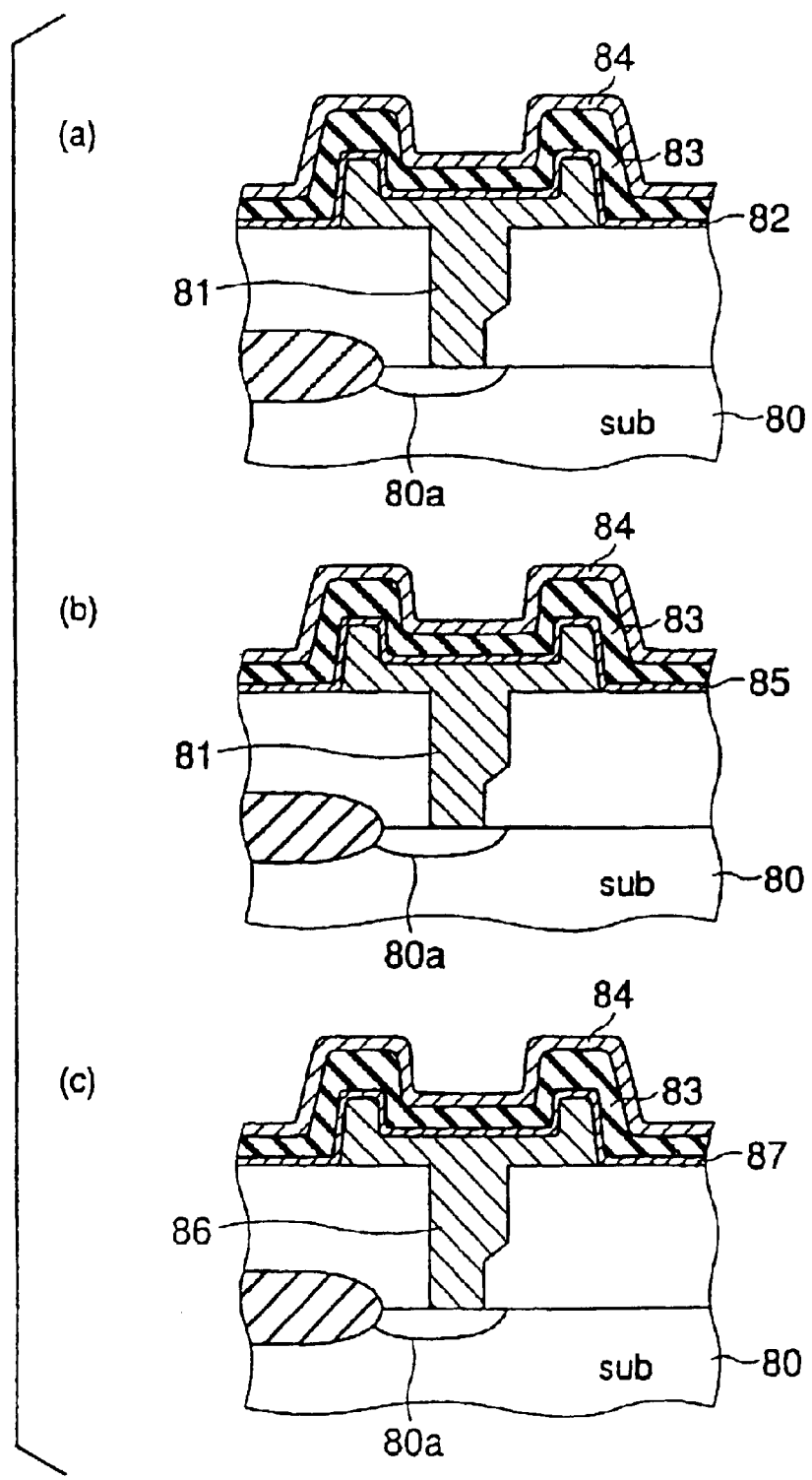

Referring to FIGS. 9(*a*) through 9(*c*), examples of a TiN-series thin film according to the present invention, which is applied to a capacitor structure of a DRAM or the like, will be described below.

In the example shown in FIG. 9(*a*), a bottom electrode layer 81 of amorphous silicon is connected to an impurity diffusion region 80*a* of a silicon substrate 80. On the bottom electrode layer 81, an insulating layer 83 of $Ta_2O_5$ or RuO is formed via an SiN barrier layer 82 which is formed by the rapid thermal nitrization (RTN) process of silicon. On the insulating layer 83, a top electrode layer 84 of a TiN-series thin film according to the present invention is formed. On the top electrode layer 84, a metal wiring layer (not shown) is formed.

Conventionally, a TiN film is used as the top electrode layer 84. However, there is a problem in that the heat treatment in a post-process causes O of $Ta_2O_5$ to diffuse into the TiN film to change to TiO, so that the thickness of the TiN film decreases to increase the thickness of $Ta_2O_5$ to reduce the capacity. Such a problem can be solved by using the top electrode 84 of the TiN-series thin film according to the present invention. In this case, the TiN-series film constituting the top electrode 84 is preferably a TiON film or a TiONP film in order to hold a high barrier characteristic. In addition, if the stacked structure of the TiN-series film and a TiNP film is provided, it is possible to obtain a good barrier characteristic while maintaining a usual specific resistance even if the thickness of the stacked structure is small. Moreover, the triple stacked structure of TiON film or TiONP film/TiNP film/TiON film or TiONP film is provided, it is possible to effectively prevent the diffusion of oxygen and metals on both sides of the top electrode layer 84.

The basic structure of the example shown in FIG. 9(*b*) is the same as that of the example shown in FIG. 9(*a*). However, in the example shown in FIG. 9(*b*), a barrier layer 85 of a TiN-series thin film according to the present invention is formed in place of the SiN barrier layer 82 on the bottom electrode layer 81. The TiN-series thin film constituting the barrier layer 85 is preferably a TiON film or a TiONP film in order to hold a high barrier characteristic. In addition, the stacked structure of the TiN-series thin film and a TiNP film may be also used.

While the TiN-series thin film according to the present invention has been applied to the metal isolation silicon (MIS) structure, the TiN-series thin film according to the present invention may be applied to a metal isolation metal (MIM) structure which uses a metal, such as ruthenium, in place of amorphous silicon for a bottom electrode. In addition, a TiN-series thin film according to the present invention may be used as a bottom electrode having the MIM structure. This example is shown in FIG. 9(*c*). In this example, a bottom electrode 86 of a TiNP film is provided in place of the bottom electrode 81 of amorphous silicon. On the bottom electrode 86, a barrier layer 87 of a TiON film or a TiONP film is provided. Furthermore, an insulating layer 83 and a top electrode layer 84 have the same structures as those in the examples shown in FIGS. 9(*a*) and 9(*b*).

Figure 8:
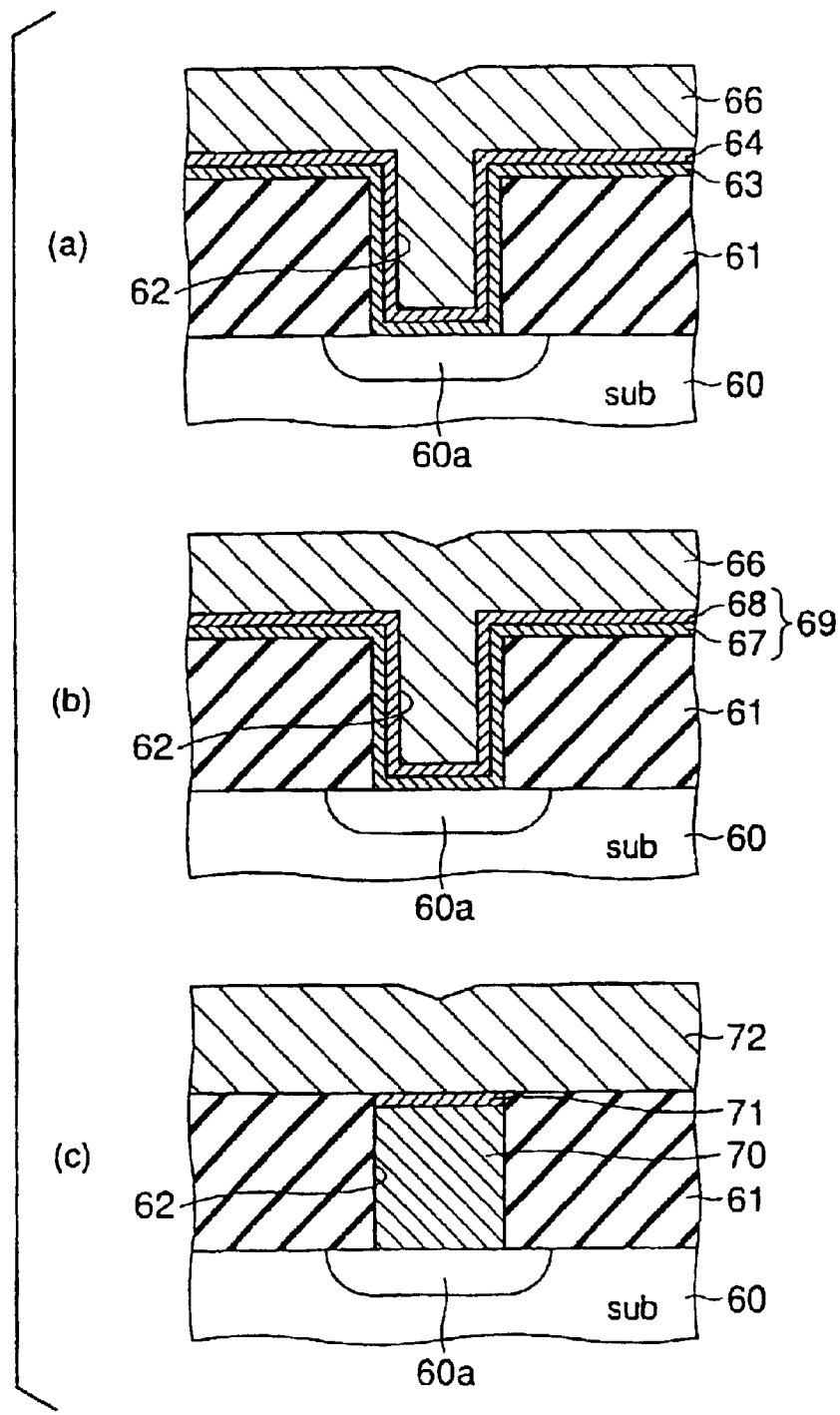
FIG. 8 is a sectional view showing examples (a) through (c) of a TiN-series thin film according to the present invention which is used for a contact part of a metal wiring layer.

In the examples shown in FIGS. 8(*a*) through 8(*c*) and 9(*a*) through 9(*c*), the TiN-series thin film according to the present invention, and the metal wiring or the insulating layer of $Ta_2O_5$, RuO or $HfO_2$ can be continuously deposited using a cluster tool type process system shown in FIG. 10. This system comprises: a transfer chamber 90 which is arranged at the center; and two cassette vessels 91 and 92, a degassing vessel 93, a deposition unit 94, a pre-cleaning unit 95, a deposition unit 96, a deposition unit 97 and a cooling vessel 98, which are arranged around the transfer chamber 90. In addition, a semiconductor wafer W is introduced into and carried out from each of the vessels by means of a transfer arm 99 which is provided in the transfer chamber 90.

In such a deposition system, one of the deposition units 94, 96 and 97 is provided for forming a TiN-series thin film according to the present invention, and other units are provided for forming a metal wiring or an insulating layer of $Ta_2O_5$ or RuO. As an example of the operation of a deposition process, the formation of the capacitor structure shown in FIG. 9(*b*) will be described below.

First, a semiconductor wafer W is taken out of the cassette vessel 91 by means of the transfer arm 99, and introduced into the pre-cleaning unit 95 utilizing the inductively coupled plasma (ICP) or remote plasma. In the pre-cleaning unit 95, oxides and so forth on the surface of the wafer W are removed by using at least one of Ar, $H_2$ and $BrCl_3$. Then, the semiconductor wafer W is introduced into the degassing vessel 93 by means of the ram 99 to degas the wafer. Thereafter, a barrier layer of a TiN-series thin film according to the present invention is deposited on the semiconductor wafer W by means of any one of the deposition units 94, 96 and 97. Thereafter, the wafer W is introduced into another deposition unit by means of the arm 99 while maintaining the vacuum state, to form an insulating layer of $Ta_2O_5$. Thereafter, the wafer W is introduced into the first deposition unit again to deposit a top electrode layer of a TiN-series thin film according to the present invention. According to circumstances, the wafer W is introduced into another deposition unit to form a metal wiring layer on the top electrode layer. Thus, a predetermined deposition process is completed, and then, the semiconductor wafer W is cooled by means of the cooling vessel 98 to be housed in the cassette vessel 92.

Referring to FIGS. 11(*a*), 11(*b*) and 12, examples of a TiN-series thin film according to the present invention, which is applied to a gate electrode, will be described below.

In the example of FIG. 11(*a*), a gate electrode 104A is provided on a silicon substrate 100 via an insulating film 101. The gate electrode 104A comprises a gate oxide film 115, a TiNP thin film 103 and a polysilicon film 102 between those films 115 and 103. On the TiNP thin film 103, a W wiring layer 106 is formed. That is, WSi of the gate electrode of the conventional double layer structure of a polysilicon and tungsten silicide (WSi) is replaced with TiNP. Furthermore, reference number 105 denotes a spacer of SiN. Since TiNP used for the gate electrode has a low resistance and an excellent barrier characteristic and is thermally stable, the structure of FIG. 11(*a*) has superior characteristics to those of the gate electrode of the conventional double structure of a polysilicon and WSi. Moreover, if it is amorphous, the barrier characteristic can be further enhanced, so that it is possible to obtain more excellent characteristics. Specifically, it is possible to achieve a higher speed, and it is possible to reduce the thickness of the film. The thickness of each of the polysilicon and tungsten silicide (WSi) of the gate electrode of the conventional double layer structure of the polysilicon and tungsten silicide is 100 nm, so that the total thickness is 200 nm. On the other hand, the thickness of the TiNP layer on the polysilicon may be in the range of from 10 to 50 nm, so that the total thickness may be in the range of from 110 to 150 nm which is far thinner than that of the gate electrode of the conventional double layer structure. When TiNP is amorphous to improve the barrier characteristic, the thickness can be particularly small.

In the example of FIG. 11(b), a gate electrode 104B comprising a gate oxide film 115 and a TiNP thin film 107 directly formed on the film 115 is provided in place of the gate electrode 104 of FIG. 11(a). As described above, the TiNP thin film has a low resistance, a high heat resistance and an excellent barrier characteristic. Therefore, the TiNP thin film alone can also obtain excellent characteristics as a gate electrode similar to the double layer structure of polysilicon/TiNP. In this case, the thickness of the TiNP gate electrode 107 is sufficient to be in the range of from about 20 nm to about 50 nm, so that it is possible to realize a very thin gate electrode. Thus, also in the case of the TiNP layer alone, it is possible to particularly reduce the thickness by causing the TiNP layer to be amorphous to improve the barrier characteristic. Incidentally, a TiON thin film may be formed between the gate oxide film 115 and the TiNP thin film 107.

Figure 12:
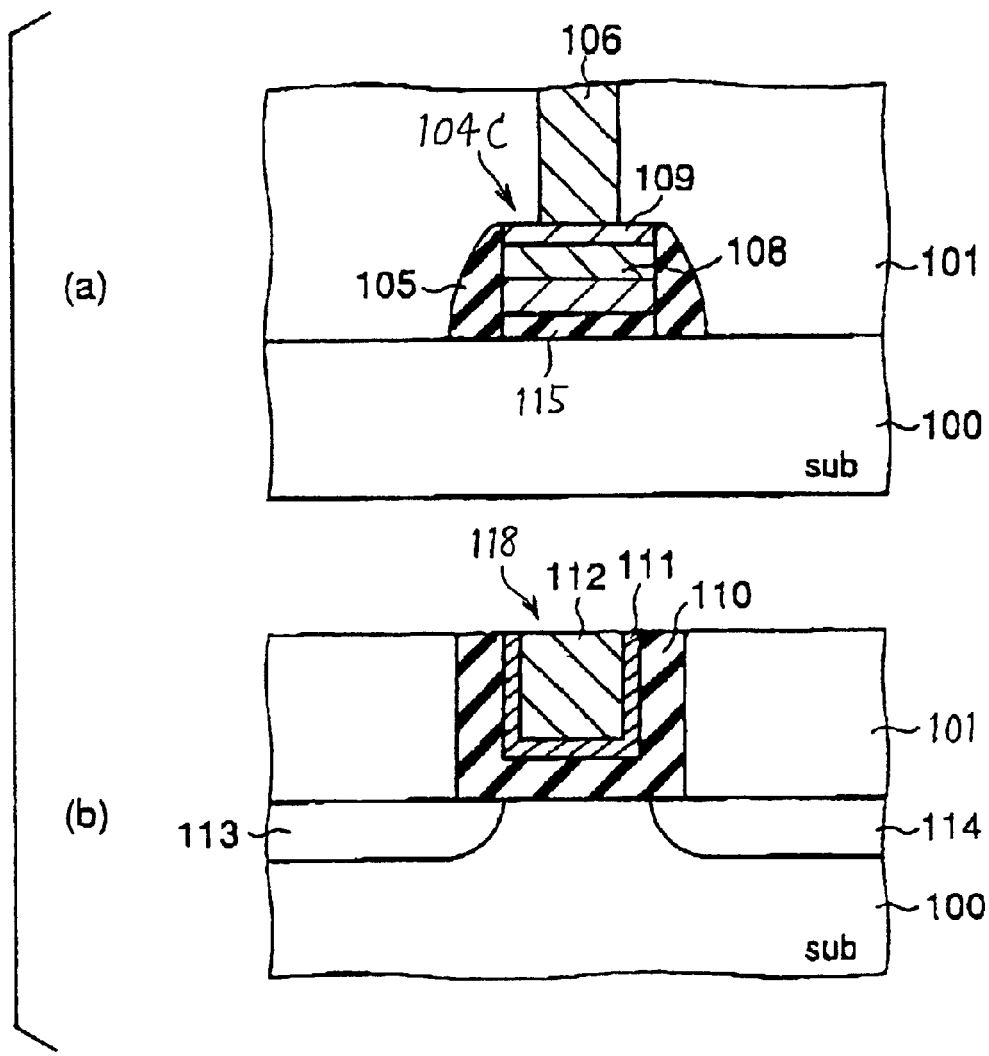
FIG. 12 is a sectional view showing examples (a) and (b) of a TiN-series thin film according to the present invention which is used for a gate electrode.

In the example of FIG. 12(a), a gate electrode 104C is used in place of the gate electrodes 104A and 104B of FIG. 11. The gate electrode 104C comprises a gate oxide film 115, a polysilicon film 116, a CoSi thin film 108 and a barrier layer 109. The barrier layer 109 is a TiN-series thin film formed by the CVD according to the present invention. The CoSi thin film 108 is formed for obtaining a contact resistance. The CoSi thin film 108 and the polysilicon film 116 have low resistance and can provide excellent characteristics to the gate electrode 104C, so that it is possible to reduce the thickness of the gate electrode itself. In addition, by the barrier layer 109 of the TiN-series thin film according to the present invention, it is possible to obtain an excellent barrier characteristic.

In the example of FIG. 12(b), an insulating layer 110 of high dielectric material is formed on a silicon substrate 100. The insulating layer 110 is made of at least one of $SiO_2$, $HfO_2$, $Ta_2O_5$, RuO, BST, PZT (Pb(Zr, Ti)$O_3$: lead zirconate titanate). Then, a barrier layer 111 of a CVD-TiN-series thin film according to the present invention is formed thereon, and a metal gate electrode 112 of Al, W or Cu is formed thereon. In FIG. 12(b), reference numbers 113 and 114 denote a source and a drain, respectively. Thus, a metal gate structure 118 capable of responding to accelerating is constructed. The barrier layer 11 of the CVD-TiN-series thin film according to the present invention can effectively prevent the relative diffusion between the gate electrode 112 and an insulating layer 110 of a high dielectric material.

An example of a TiN-series thin film according to the present invention, which is applied to a contact structure for forming a wiring in a diffusion region formed in the major surface of a semiconductor substrate, will be described below. In an example of FIG. 13, a contact layer 122 of a TiSi thin film or a CoSi thin film is formed on a diffusion region (source or drain) 121 which is formed in the major surface of a silicon substrate 120. Then, a barrier layer 123 of a TiN-series thin film according to the present invention is formed thereon, and a wiring layer 124 of Al, W or Cu is formed thereon. In this case, since the TiSi thin film and the CoSi thin film have a low resistance, these thin films can have good characteristics as a contact layer, and it is possible to obtain a good barrier characteristic by the TiN-series thin film according to the present invention, so that it is possible to obtain a contact structure having very good characteristics. Furthermore, reference number 125 denotes a gate electrode.

Furthermore, the present invention should not be limited to the above described preferred embodiments, but the invention can be modified in various ways. For example, the conditions in each process are merely described as an example, so that the conditions may be suitably set in accordance with processes. In addition, the substrate to be used should not be limited to the semiconductor wafer, but it may be another substrate. Moreover, another layer may be formed on the surface of the substrate. In addition, while the TiN-series thin film has been deposited by the thermal CVD in the above described preferred embodiments, the present invention should not be limited thereto, but other CVDs may be used. However, if the thermal CVD is used for the deposition, the TiN-series thin film can be relatively easily formed without the need of any complicated processes, so that the thermal CVD is preferably used for the deposition.

Although the preferred embodiments have been represented by the TiN-series thin films, the present invention is not limited to the deposition of the TiN-series thin films. That is to say, the present invention can be applied to metallic nitride series thin films other than the TiN-series thin films. Such metallic nitride series thin films include Al, W, Zr, Hf, Ru, Ta, and La nitride series thin films. To deposit each metallic nitride series thin film, corresponding metallic element containing gas and N-containing gas are used as the process gases. O-containing gas can be used as an additional process gas.

For example, Al-containing gas is at least one of $Al(OC_2H_5)_3$ gas, $Al(OCH_3)_3$ gas and $AlCl_3$ gas. W-containing gas is at least one of $WF_6$ gas and $W(CO)_6$ gas. Zr-containing gas is at least one of $ZrCl_4$ gas and $Zr[N(OC_2H_5)_2]_4$ gas. Hf-containing gas is at least one of $HfCl_4$ gas and $Hf[N(OC_2H_5)_2]_4$ gas. Ru-containing gas is at least one of $RU(CO)_5$ gas and $RuCl_3$ gas. Ta-containing gas is at least one of $TaCl_5$ gas, $Ta(OC_2H_5)_3$ gas and $Ta(OCH_3)_3$ gas. La-containing gas is at least one of $LaCl_3$ gas, $La(OC_2H_5)_3$ gas and $La(OCH_3)_3$ gas. The N-containing gas is $NH_3$ gas and the O-containing gas is at least one of $O_2$ gas, NO gas and $N_2O$ gas.

When depositing the TiN-series thin films, as Ti-containing gases, $TiI_4$ gas, $Ti(OC_2H_5)_3$ gas and/or $Ti(OCH_3)_3$ gas can be used in addition to/in place of the $TiCl_4$ gas. Furthermore, TiN-series thin films can contain B (boron) in place of P (phosphorus). In this case, at least one of $BH_3$ gas and $B_2H_6$ gas is used in place of $PH_3$ gas.

The metallic nitride series thin film can be generally used as an intermediate layer between first and second conductive layers and/or an intermediate layer between a dielectric layer on the first conductive layer and the second conductive layer. In this case, the first conductive layer may be one of a TiSi layer, a CoSi layer and a Si layer, and the second conductive layer may be one of an Al layer, a W layer and a Cu layer. In addition, a polysilicon layer can be used as the first conductive layer. The dielectric layer may comprise at least one of $SiO_2$, SiON, $HfO_2$, ZrO, $Ta_2O_5$, RuO, PZT and BST.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for depositing a TiN-series thin film, comprising the steps of:

arranging a substrate in a process vessel;
evacuating said process vessel;
pre-heating said substrate while introducing a $N_2$ gas and a $NH_3$ gas into said process vessel; and
introducing a $TiCl_4$ gas and said $N_2$ gas through first respective gas lines and a first main flow line, and introducing an O-containing gas and said $NH_3$ gas through second respective gas lines and a second main flow line, into said process vessel to form a thin film containing Ti, O and N on said substrate by a CVD,
said method further comprising, between said pre-heating step and said introducing step, the step of pre-flowing said $TiCl_4$ gas and said O-containing gas through said respective first and second gas lines and pre-flow lines, without introducing same through said main flow lines into said process vessel.

2. The method for depositing a TiN-series thin film as set forth in claim 1, which further comprises a step of introducing an O-containing gas into said process vessel before and/or after said step of forming the thin film containing Ti, O and N.

3. The method for depositing a TiN-series thin film as set forth in claim 1, wherein said O-containing gas is an $O_2$ gas and a flow ratio of said $O_2$ gas to said $NH_3$ gas is in the range of from 0.0001 to 0.001.

4. The method for depositing a TiN-series thin film as set forth in claim 1, wherein flow rates of said gases in said preflowing step are equal to those in said introducing step.

5. A method for depositing a TiN-series thin film, said method comprising the steps of:
arranging a substrate in a process vessel;
evacuating said process vessel, while heating said substrate;
pre-heating said substrate while introducing a $N_2$ gas and a $NH_3$ gas into said process vessel;
pre-flowing a $TiCl_4$ gas, an O-containing gas and a $PH_3$ gas, without introducing same into said process vessel; and
introducing said $TiCl_4$ gas, said $N_2$ gas, said $NH_3$ gas, said O-containing gas and said $PH_3$ gas into said process vessel to form a thin film containing Ti, O, N and P on said substrate by a CVD.

6. The method for depositing a TiN-series thin film as set forth in claim 5, which further comprises a step of introducing an O-containing gas into said process vessel before and/or after said step of forming the thin film containing Ti, O, N and P.

7. The method for depositing a TiN-series thin film as set forth in claim 5, wherein said O-containing gas is an $O_2$ gas and a flow ratio of said $O_2$ gas to said $NH_3$ gas is in the range of from 0.0001 to 0.001.

8. The method for depositing a TiN-series thin film as set forth in claim 5, wherein flow rate of said $PH_3$ is in the range of from 0.04 to 0.5 L/min.

9. A method for depositing a TiN-series thin film, said method comprising the steps of:
arranging a substrate in a process vessel;
evacuating said process vessel, while heating said substrate;
pre-heating said substrate while introducing a $N_2$ gas and a $NH_3$ gas into said process vessel;
pre-flowing a TiCl gas and an O-containing gas, without introducing same into said process vessel;
introducing said $TiCl_4$ gas, said $N_2$ gas, said $NH_3$ gas and said O-containing gas into a process vessel to form a first thin film containing Ti, O and N by a CVD;
pre-flowing $TiCl_4$ gas and $PH_3$ gas, without introducing same into said process vessel; and
introducing said $TiCl_4$ gas, said $N_2$ gas, said $NH_3$ gas and said $PH_3$ gas into said process vessel to form a second thin film containing Ti, N and P on said first thin film by a CVD.

10. The method for depositing a TiN-series thin film as set forth in claim 9, wherein said O-containing gas is an $O_2$ gas and a flow ratio of said $O_2$ gas to said $NH_3$ gas is in the range of from 0.0001 to 0.001.

11. The method for depositing a TiN-series thin film as set forth in claim 9, wherein flow rate of said $PH_3$ is in the range of from 0.04 to 0.5 L/min.

12. A method for depositing a TiN-series thin film, said method comprising the steps of:
arranging a substrate in a process vessel;
evacuating said process vessel, while heating said substrate;
pre-heating said substrate while introducing a $N_2$ gas and a $NH_3$ gas into said process vessel;
pre-flowing a $TiCl_4$ gas and a first O-containing gas, without introducing same into said process vessel;
introducing said $TiCl_4$ gas, said $N_2$ gas, said $NH_3$ gas and said first O-containing gas into a process vessel to form a first thin film containing Ti, O and N by a CVD;
pre-flowing a $TiCl_4$ gas and a $PH_3$ gas, without introducing same into said process vessel;
introducing said $TiCl_4$ gas, said $N_2$ gas, said $NH_3$ gas and said $PH_3$ gas into said process vessel to form a second thin film containing Ti, N and P on said first thin film by a CVD;
pre-flowing a $TiCl_4$ gas and a second O-containing gas, without introducing same into said process vessel; and
introducing said $TiCl_4$ gas, said $N_2$ gas, said $NH_3$ gas and said second O-containing gas into said process vessel to form a third thin film containing Ti, O and N on said second thin film by a CVD.

13. The method for depositing a TiN-series thin film as set forth in claim 12, wherein each of said first and second O-containing gases is an $O_2$ gas and a flow ratio of said $O_2$ gas to said $NH_3$ as being in the range of from 0.000 1 to 0.001.

14. The method for depositing a TiN-series thin film as set forth in claim 12, wherein flow rate of said $PH_3$ is in the range of from 0.04 to 0.5 L/min.

15. A method for depositing a TiN-series thin film, said method comprising the steps of:
arranging a substrate in a process vessel;
evacuating said process vessel, while heating said substrate;
pre-heating said substrate while introducing a $N_2$ gas and a $NH_3$ gas into said process vessel;
pre-flowing a $TiCl_4$ gas and a $PH_3$ gas, without introducing same into said process vessel; and
introducing said $TiCl_4$ gas, said $N_2$ gas, said $NH_3$ gas and said $PH_3$ gas into said process vessel to form a thin film containing Ti, N and P on said substrate by a CVD.

16. The method for depositing a TiN-series thin film as set forth in claim 15, wherein flow rate of said $PH_3$ is in the range of from 0.04 to 0.5 L/min.

17. A method for producing a film structure, said method comprising the steps of:
forming a first conductive layer on a substrate;
forming a TiN-series thin film on said first conductive layer; and forming a second conductive layer on said TiN-series thin film,
wherein said step of forming a TiN-series thin film includes the sub-steps of:
arranging said substrate in a process vessel;
evacuating said process vessel, while heating said substrate;
pre-heating said substrate while introducing a $N_2$ gas and a $NH_3$ gas into said process vessel; and
introducing a $TiCl_4$ gas and said $N_2$ gas through first respective gas lines and a first main flow line, and said $NH_3$ gas and introducing at least one of said O-containing gas and said $PH_3$ gas through second respective gas lines and a second main flow line, into said process vessel to form a thin film containing Ti, N, and at least one of O and P on said first conductive layer by a CVD,
said step of forming a TiN-series thin film further including, between said pre-heating sub-step and said introducing sub-step, the sub-step of pre-flowing said $TiCl_4$ gas and said at least one of said O-containing gas and said $PH_3$ gas through said respective first and second gas lines and pre-flow lines, without introducing same through said main flow lines into said process vessel.

18. The method for producing a film structure as set forth in claim 17, wherein said first conductive layer is one of a TiSi layer, a CoSi layer and a Si layer, and said second conductive layer is one of an Al layer, a W layer and a Cu layer.

19. The method for producing a film structure as set forth in claim 17, wherein said first conductive layer is a polysilicon layer, and said second conductive layer is one of an Al layer, a W layer and a Cu layer.

20. The method for producing a film structure as set forth in claim 19, wherein said film structure is constructed as a contact structure of a semiconductor device.

21. The method for producing a film structure as set forth in claim 17, wherein flow rates of said gases in said pre-flowing sub-step are equal to those in said introducing step.

22. A method for depositing a metallic nitride series thin film, said method comprising the steps of:
arranging a substrate in a process vessel;
evacuating said process vessel, while heating said substrate;
pre-heating said substrate while introducing an inert gas and a reducing gas into said process vessel; and
introducing said metallic-element containing gas and said inert gas through first respective gas lines and a first main flow line, and introducing said reducing gas and at least one of an O-containing gas, a $PH_3$ gas, a $BH_3$ gas and a $B_2H_6$ gas through second respective gas lines and a second main flow line, into said process vessel to form a metallic nitride thin film containing at least one of O, P and B on said substrate by a CVD,
said method further comprising, between said pre-heating step and said introducing step, the step of pre-flowing said metallic-element containing gas and at least one of said O-containing gas, said $PH_3$ gas, said $BH_3$ gas, and said $B_2H_6$ gas through said respective first and second gas lines and pre-flow lines, without introducing same through said main flow lines into said process vessel.

23. The method for depositing a metallic nitride series thin film as set forth in claim 22, wherein said metallic element is one of Ti, Al, W, Zr, Hf, Ru, Ta, and La.

24. The method for depositing a metallic nitride series thin film as set forth in claim 22, further comprising the steps of introducing an O-containing gas into said process vessel before and after said step of forming a metallic nitride series thin film.

25. The method for depositing a TiN-series thin film as set forth in claim 24, which further comprises a step of introducing an O-containing gas into said process vessel before and/or after said step of forming the thin film containing Ti, N and P.

26. The method for depositing a metallic nitride series thin film as set forth in claim 24, wherein said O-containing gas is one of $O_2$, NO and $N_2O$ gases.

27. The method for depositing metallic nitride series thin film as set forth in claim 22, wherein flow rates of said gases in said pre-flowing step are equal to those in said introducing step.

28. A method for producing a film structure, said method comprising the steps of:
forming a dielectric layer on a first conductive layer;
forming a metallic nitride series thin film on said dielectric layer; and
forming a second conductive layer on said metallic nitride series thin film,
wherein said step of forming a metallic nitride series thin film includes the sub-steps of:
pre-flowing a metallic-element containing gas through its gas line and pre-flow line, without introducing same through a first flow line into a process vessel; and
introducing said metallic-element containing gas and a $N_2$ gas through first respective gas lines and said first main flow line, and introducing a $NH_3$ gas and at least one of an O-containing gas, a $PH_3$ gas, $BH_3$, and a $B_2H_6$ gas through second respective gas lines and a second main flow line, into said process vessel to form said metallic nitride series thin film comprising at least one of a thin film containing said metallic-element, O and N, a thin film containing said metallic-element, N and P, a thin film containing said metallic-element, N and B, a thin film containing said metallic-element, O, N and P and a thin film containing said metallic-element, O, N and B, by a CVD.

29. The method for depositing a metallic nitride series thin film as set forth in claim 28, wherein said metallic element is one of Ti, Al, W, Zr, Hf, Ru, Ta, and La.

30. The method for depositing a metallic nitride series thin film as set forth in claim 28, further comprising the steps of introducing an O-containing gas into said process vessel before and after said step of forming a metallic nitride series thin film.

31. The method for depositing a metallic nitride series thin film as set forth in claim 30, wherein said O-containing gas is one of $O_2$, NO and $N_2O$ gases.

32. The method for producing a film structure as set forth in claim 28, wherein said first conductive layer is a Si layer, and said dielectric layer comprises at least one of $SiO_2$, SiON, $HfO_2$, ZrO, $Ta_2O_5$, RuO, PZT and BST, and said second conductive layer is one of an Al layer, a W layer and a Cu layer.

33. The method for producing a film structure as set forth in claim 32, wherein said film structure is constructed as a metal gate electrode structure of a semiconductor device.

34. The method for producing a film structure as set forth in claim 28, wherein said first conductive layer is a Si layer, said dielectric layer comprises at least one of $SiO_2$, SiON, $HfO_2$, ZrO, $Ta_2O_5$, RuO, PZT and BST, and said second conductive layer is a polysilicon layer, said method further comprising the steps of:

forming a metallic nitride series thin film on said polysilicon layer; and forming one of an Al layer, a W layer and a Cu layer on said metallic nitride series thin film.

35. The method for producing a film structure as set forth in claim 34, wherein said film structure is constructed as a poly metal gate electrode structure of a semiconductor device.

36. The method for producing a film structure as set forth in claim 28, wherein said first conductive layer is one of a polysilicon layer, a metal layer and a metallic nitride layer, said dielectric layer comprises at least one of $SiO_2$, SiON, $HfO_2$, ZrO, $Ta_2O_5$, RuO, PZT and BST, and said second conductive layer is one of a metal layer and a metallic nitride layer.

37. The method for producing a film structure as set forth in claim 36, wherein said film structure is constructed as a capacitor electrode structure of a semiconductor device.

38. A method for depositing a metallic nitride series thin film, said method comprising the steps of:

arranging a substrate in a process vessel;

evacuating said process vessel, while heating said substrate;

pre-heating said substrate while introducing a N-containing gas into said process vessel;

pre-flowing a metallic-element containing gas through its gas line and a pre-flow line, without introducing said metallic-element containing gas through a first main flow line into said process vessel; and introducing said metallic-element containing gas and an inert gas through first respective gas lines and said first main flow line, and introducing a reducing gas through its gas line and a second main flow line, into said process vessel to form a metallic nitride series thin film on said substrate by a CVD.

39. The method for depositing a metallic nitride series thin film as set forth in claim 38, wherein said metallic element is one of Ti, Al, W, Zr, Hf, Ru, Ta, and La.

40. The method for depositing a metallic nitride series thin film as set forth in claim 38, further comprising the steps of introducing an O-containing gas into said process vessel before and after said step of forming a metallic nitride series thin film.

41. The method for depositing a metallic nitride series thin film as set forth in claim 40, said O-containing gas is one of $O_2$, NO and $N_2O$ gases.

42. The method for depositing metallic nitride series thin film as set forth in claim 38, wherein a flow rate of said metallic-element containing gas in said pre-flowing step is equal to that in said introducing step.

43. The method for depositing a metallic nitride series thin film as set forth in claim 38, wherein said gas lines are each provided with a mass flow controller and said pre-flow line is connected to said gas line between said mass flow controller and said first main flow line.

* * * * *

UNITED STATES PATENT AND TRADEMARK OFFICE
CERTIFICATE OF CORRECTION

| | |
|---|---|
| PATENT NO. | : 6,824,825 B2 |
| APPLICATION NO. | : 10/307487 |
| DATED | : November 30, 2004 |
| INVENTOR(S) | : Hayashi Otsuki |

It is certified that error appears in the above-identified patent and that said Letters Patent is hereby corrected as shown below:

On the title page, left column, please insert

--(30) Foreign Application Priority Data

Sep. 13, 1999     (JP).......11-258609--

Signed and Sealed this

Twelfth Day of September, 2006

JON W. DUDAS
*Director of the United States Patent and Trademark Office*